US012791596B2

(12) United States Patent
Ringwald et al.

(10) Patent No.: US 12,791,596 B2
(45) Date of Patent: Nov. 10, 2026

(54) ELECTROMAGNETIC PROPAGATION INTERFERENCE MONITORING APPARATUS

(71) Applicant: The United States of America, as Represented by the Secretary of the Navy, Crane, IN (US)

(72) Inventors: Timothy P. Ringwald, Loogootee, IN (US); Katherine G. Parkes, Bloomington, IN (US); Jeffrey A. Miller, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 199 days.

(21) Appl. No.: 18/751,623

(22) Filed: Jun. 24, 2024

(65) Prior Publication Data

US 2024/0426885 A1 Dec. 26, 2024

Related U.S. Application Data

(60) Provisional application No. 63/522,761, filed on Jun. 23, 2023.

(51) Int. Cl.
*G01R 29/08* (2006.01)

(52) U.S. Cl.
CPC ................................ *G01R 29/0871* (2013.01)

(58) Field of Classification Search
CPC ........................... G01R 29/0871; G01R 29/08; G01R 29/0807; G01R 29/0878; G01R 29/0885; G01R 29/10; G01R 29/12; G01R 29/14; G01R 35/00; G01R 19/2513; G01R 31/00; H04L 27/04; H04L 43/50; H04L 67/125
See application file for complete search history.

(56) References Cited

U.S. PATENT DOCUMENTS

| | | | | |
|---|---|---|---|---|
| 2012/0052811 A1* | 3/2012 | Watson | ................ | H04B 17/309 455/62 |
| 2018/0313877 A1* | 11/2018 | Brant | ..................... | G01R 23/02 |

* cited by examiner

*Primary Examiner* — Alvaro E Fortich
(74) *Attorney, Agent, or Firm* — Naval Surface Warfare Center, Crane Division; Patrick B. Law

(57) ABSTRACT

Disclosed is a portable apparatus for spectrum analysis including a display mode that provides quick and easy display of surrounding RF spectra that assists a user in determining whether electromagnetic propagation interference is extant. The apparatus includes a handheld enclosure housing a programmable spectrum analyzer to receive various EM spectra in the user's location and a processor coupled thereto to analyze and process the spectrum data. Additionally, the apparatus includes a display device configured to display electromagnetic spectrum information derived from the spectrum analyzer module in a mode that is easy and quickly understood. Still further, the apparatus includes a battery adapter apparatus configured to communicatively couple with any of a plurality of common battery devices.

11 Claims, 7 Drawing Sheets

ELECTROMAGNETIC PROPAGATION INTERFERENCE MONITORING APPARATUS

CROSS-REFERENCE TO RELATED APPLICATIONS

The present application claims priority to and the benefit of U.S. Provisional Patent Application Ser. No. 63/522,761 filed Jun. 23, 2023, and entitled "ELECTROMAGNETIC PROPAGATION INTERFERENCE MONITORING APPARATUS," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 211636US02) is assigned to the United States Government and is available for licensing for commercial purposes. Licensing and technical inquiries may be directed to the Technology Transfer Office, Naval Surface Warfare Center Crane, email: Crane_T2@navy.mil.

FIELD

The present disclosure generally relates to electromagnetic (EM) propagation interference monitoring and, more particularly, to an easily transportable or handheld apparatus providing EM spectrum analysis that quickly and easily displays information about the EM signal spectrum in a local geographic area of a user of the device.

BACKGROUND

In situations where warfighters need to quickly understand what the EM spectrum around them looks like and whether they might be experiencing EM propagation interference (e.g., radio frequency (RF) jamming), portable spectrum analyzers are helpful. Known handheld and/or portable spectrum analyzers, however, are either still too large, heavy, and/or bulky for field use or display the EM spectrum information in a way that is not quickly ascertainable by an untrained user, for example. Accordingly, there is a need for a spectrum analysis device that is both easily transportable and enables a user to quickly and easily receive information about the spectrum around them, such as whether they being jammed (e.g., EM propagation interference) or who is around them and transmitting and/or receiving in the EM spectrum.

SUMMARY

The present disclosure includes an apparatus for spectrum analysis. The apparatus includes a handheld enclosure including a processor and a memory coupled to the processor. The apparatus also includes a programmable spectrum analyzer module communicatively coupled to the processor and a selectively attachable radio frequency (RF) antenna coupled to spectrum analyzer and configured to be selectively attached to the enclosure. Additionally, the apparatus includes a display device configured to display electromagnetic spectrum information derived from the spectrum analyzer module. Still further, the apparatus includes a power conversion and distribution module configured to provide one or more selected voltages to the processor and spectrum analyzer module, and a battery adapter apparatus coupled to the enclosure and communicatively coupled to the power conversion and distribution module and configured to communicatively couple with any of a plurality of common battery devices.

According to further aspects, the present disclosure provides a portable spectrum analysis device including a processor, a selectively attachable radio frequency (RF) antenna and configured to selectively attach to a handheld enclosure, a spectrum analyzer communicatively coupled to the selectively attachable RF antenna and the processor, the spectrum analyzer configured to determine one or more radio frequency (RF) spectra data based on RF signals received with the selectively attachable radio RF antenna and provide the one or more RF spectra data to the processor for processing into electromagnetic spectrum information, and a display disposed in an outer surface of the handheld enclosure for displaying the electromagnetic spectrum information to a user of the device.

Additional features and advantages of the present disclosure will become apparent to those skilled in the art upon consideration of the following detailed description of the illustrative embodiments and examples.

DETAILED DESCRIPTION

The embodiments and examples of the presently disclosed invention described herein are not intended to be exhaustive or to limit the present disclosure to the precise forms disclosed. Rather, the embodiments and examples selected for description have been chosen to enable one skilled in the art to practice the present invention.

Figure 1:
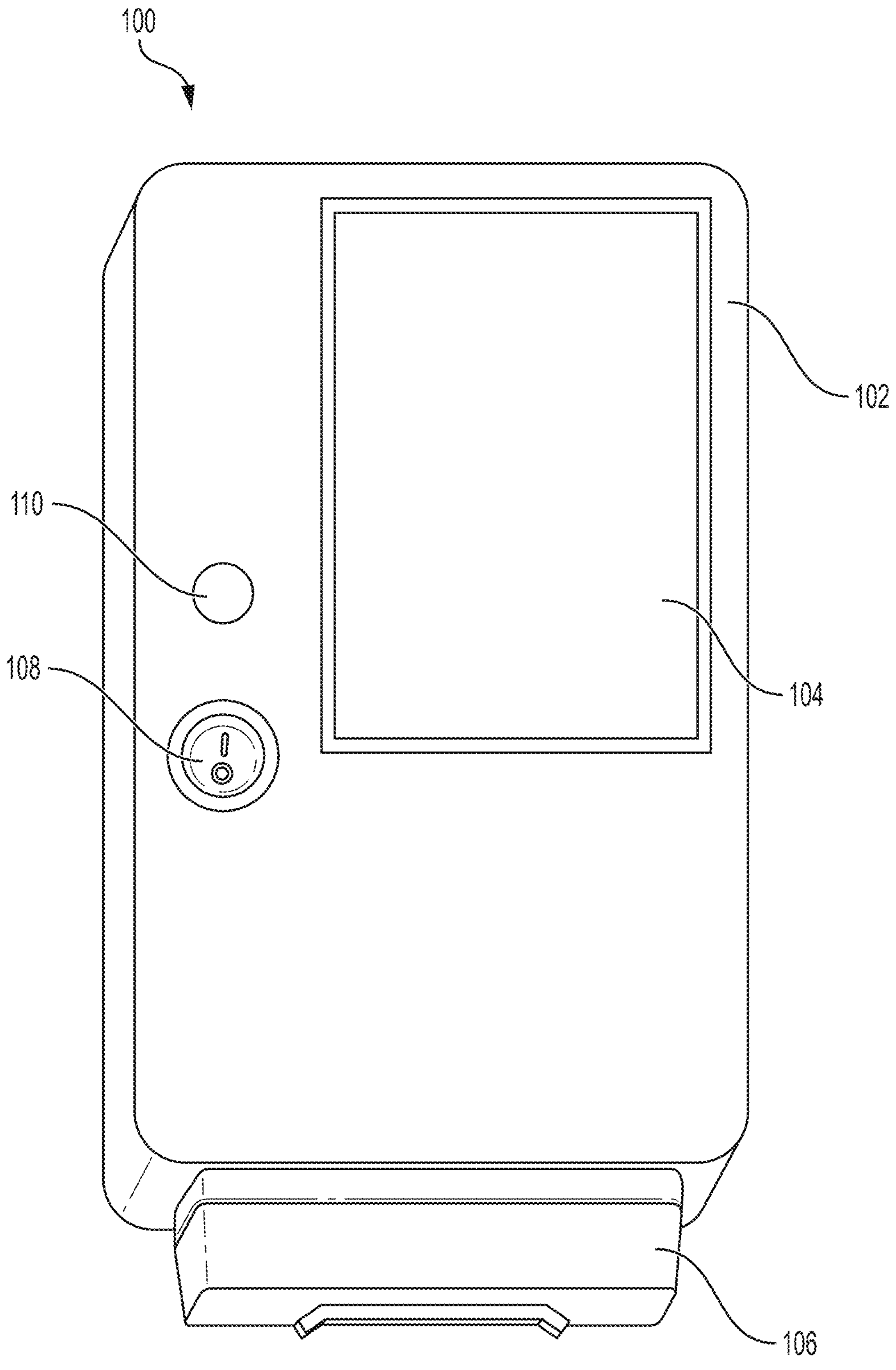
FIG. 1 illustrates an exterior view of an exemplary electromagnetic propagation interference monitoring apparatus according to some aspects of the present disclosure.

FIG. 1 illustrates an exterior view of an exemplary electromagnetic propagation interference monitoring apparatus 100 according to some aspects. As shown, the apparatus 100 includes an enclosure 102, which may be configured to be handheld, and a display device 104 (e.g., LCD screen, touchscreen, LED screen, etc.) disposed in or on a surface of the enclosure 102. The apparatus 100 includes components to be discussed below that analyze the EM spectrum and then display the information to user on the display device 104 in bar and color form showing the level of spectrum usage for various spectra being analyzed. This manner of displaying the information enhances the case and readiness of obtaining the information quickly by a user opposed to a traditional spectrum analyzer display, which typically would require training and education to understand.

Additionally, the apparatus 100 includes a battery adapter and connector 106. In aspects, the battery adapter and connector 106 is configured to interface and couple with standard batteries that may be carried by a warfighter, for example. Accordingly, specialty batteries or battery packs are not needed for powering the apparatus 100. In further aspects, the battery adapter and connector 106 may be selectively removable to allow for selection of a number of various different battery adapters and connectors 106 that respectively are configured to interface with corresponding standard battery packs or batteries. The apparatus 100 may also include a power switch 108 for powering the apparatus 100 on and off for battery conservation, and a power indicator 110, such as a light emitting diode or similar indicator.

Furthermore, the apparatus 100 including enclosure 102 is configured to be portable and lightweight and may constitute a handheld device capable of handheld operation. For example, the present apparatus 100 reduces the weight from a typical eight pound spectrum analyzer to a weight of three pounds for less, and the size is equivalent to the size of a water bottle size or even smaller for field use.

As mentioned above, the apparatus is configured to display EM spectrum data in the form as easy to use "progress bars" with color indications to show the level of spectrum usage in various spectra (e.g., cellular, Push to Talk (PTT), Mobile User Objective System (MUOS), Single Channel Ground and Airborne Radio Systems (SINCGARS), GPS, WiFi, etc.), which enhances case and readiness of getting information to the user rather than traditional spectrum analyzer display. In alternatives, the apparatus 100 may be configured to simply display means such as red, yellow, green go/no go indicators for quickly displaying information to user.

Figure 2:
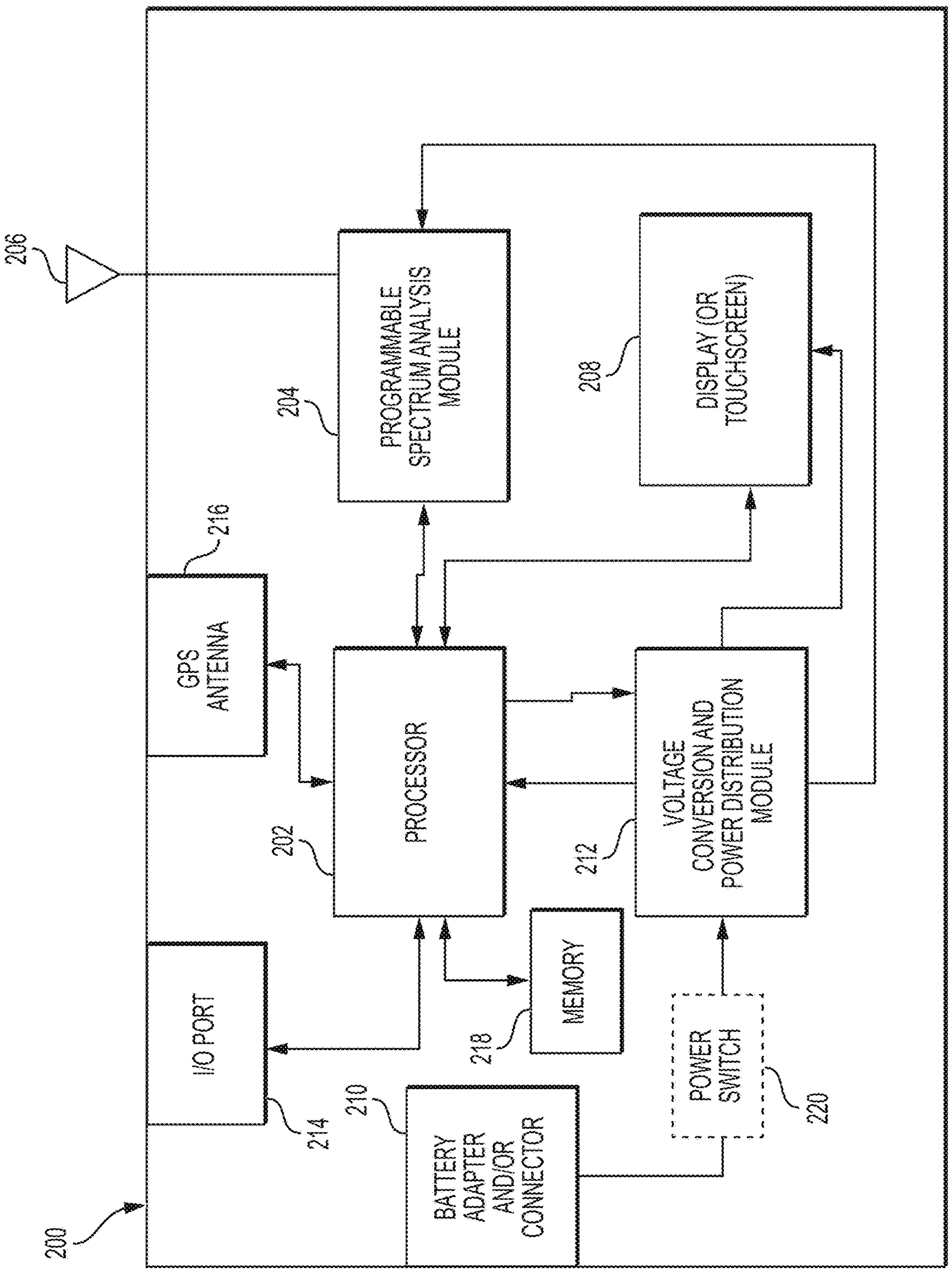
FIG. 2 illustrates an exemplary system diagram of components in an exemplary electromagnetic propagation interference monitoring apparatus according to some aspects of the present disclosure.

FIG. 2 illustrates an exemplary system diagram of various components in an exemplary electromagnetic propagation interference monitoring apparatus 200 according to some aspects of the present disclosure. As shown, the apparatus includes a processor 202 that controls the apparatus 200. In one example, the processor 200 may be implemented by a Raspberry Pi single board computer, but the processor 200 is not limited to such. Furthermore, the apparatus 200 further includes a programmable spectrum analysis module 204, which is configured to detect, scan, and/or process EM transmissions. In a particular aspect, the module 204 may be implemented as a software defined radio (SDR), such as HackRF One SDR that is capable of transmission and/or reception of radio frequency (RF) signals from 1 MHz to 6 GHz. In some aspects, the module 204 may be communicatively coupled with processor 202 and act as a peripheral that may be programmed or controlled by the processor 202, such as to select various frequency bands/spectra that the module 204 is to detect. Alternatively, the module 204 may be pre-programmed to scan or detect the various frequency bands/spectra and then feed that information to processor 202 for further analysis and processing, as well as display. In yet further aspects, the coupling between module 204 and processor 202 may include a coaxial connection such as a subminiature version A (SMA) connector that is coupled to a selectively attachable antenna 206, which can be removed for portability when the apparatus 200 is not being used.

Additionally, the apparatus 200 includes a display device 208 (e.g., LCD or LED display or similar display means) that is used by the processor 202 to display RF information for one or more spectra being monitored. In one aspect, the processor 202 processes the spectrum information and displays this information in the form of the "progress bars" with an further color scheme as will be further discussed in connection with FIGS. 5 and 6. In further aspects, the display device 208 may be implemented with a touch screen allowing a user to provide inputs to the processor directly via the display device 208.

In yet further aspects, the apparatus 200 may include a battery adapter and/or connector apparatus 210, which enables various types of batteries to be used to power the apparatus 200. This is particularly advantageous in that commonly used batteries for other types of devices can be used with this device, and thus specific batteries are not required in the field. Furthermore, the apparatus 200 includes a voltage conversion and power distribution module 212 (which can be further controlled by processor 202) that converts the voltage from a battery (not shown in this figure) coupled to connector 210 to one or more voltages used by the processor 202, the module 204, and the screen 208 and distributes the power as needed and at the requirements for each of components/modules.

In still further aspects, the apparatus may include an input/output port 214 that affords coupling of the device 200 to an external network, such as for downloading logged data and uploading software updates. In further aspects, the processor 202 may be coupled to a memory device 218 containing computer implementable code or instructions for processing spectrum data as well as storing/logging spectrum data for future downloading of such data. The memory device may also be configured to log or record location data from GPS. This affords the ability of device 200 to couple location data with RF environmental data to allow for a larger picture capture of information, which is a capability that is not afforded by typical known handheld spectrum analyzers.

According to another embodiment, the apparatus 200 may include GPS tracking that is implemented by either processor 202 in combination with a coupled USB GPS antenna 216, or a separate GPS receiver (not shown) that feeds location data to the processor 202. The inclusion of location tracking with a GPS antenna/receiver allows for logging of RF spectra tied to a particular geographic location of the apparatus 200 and the time of location. According to yet further aspects, the apparatus may include some means of turning the data logging capability on and off, such as a pushbutton (not shown) or touchscreen input to allow for an internal application change to a data logging capability that stores location and RF spectra information to be sent back to the a common operating picture system (IS2OPS) to allow for a larger picture of the RF environment from remote locations.

The apparatus 200 may also include a power switch 220, which allows the unit 200 to be affirmatively powered off to conserve battery energy. In other aspects, the processor 2002 may be configured with a sleep function to conserve energy and waking of the system triggered with a touchscreen input, as an example. It is noted that apparatus 200 may be used to implement or analogous to apparatus 100 in some aspects.

Figure 3:
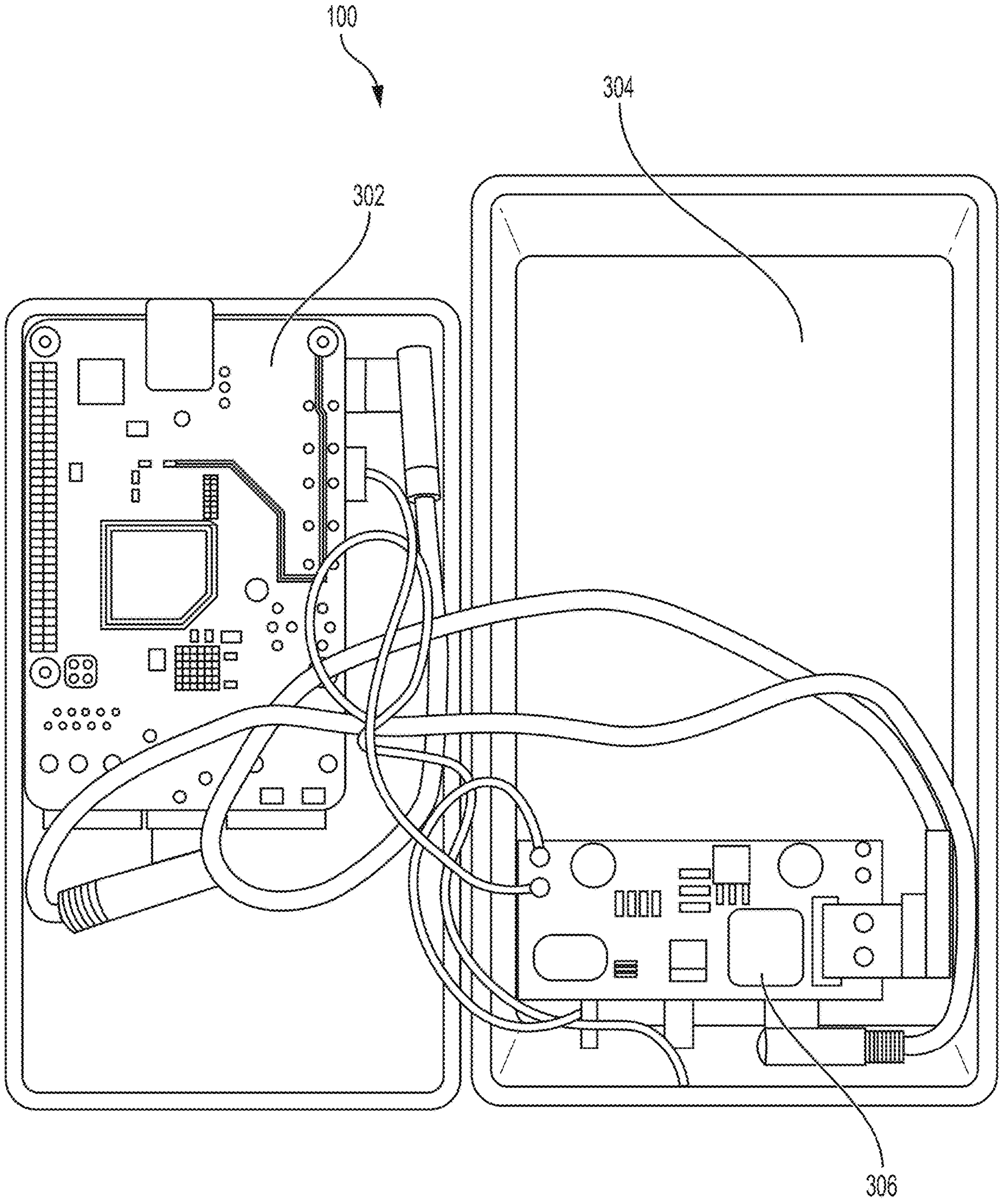
FIG. 3 illustrates an interior view of component within the exemplary electromagnetic propagation interference monitoring apparatus of FIG. 1 according to some aspects of the present disclosure.

FIG. 3 illustrates an interior view of component within the exemplary electromagnetic propagation interference monitoring apparatus 100 of FIG. 1 (or alternatively apparatus 200 in FIG. 2) according to some aspects of the present disclosure. As shown, apparatus 100 includes a processor board 302, which may be implemented with a Raspberry Pi or other equivalent processor or computer. This processor 302 may be analogous to processor 202 in FIG. 2 as well.

As shown, apparatus 100 may also include a spectrum analysis radio (e.g., a software defined radio (SDR)) 304, which may be implemented with a HackRF One SDR or equivalent software defined radio device. This SDR 304 may be analogous to programmable spectrum analysis module 204 in FIG. 2 as well. Still further, apparatus 100 as illustrated in FIG. 3 may include a power convertor/distributor 306, which couples to the battery (not shown), as well as to the SDR 304 and processor 302 for supply of power. This power convertor/distributor 306 may be analogous to voltage conversion and power distribution module 212 in FIG. 2 as well.

Figure 4:
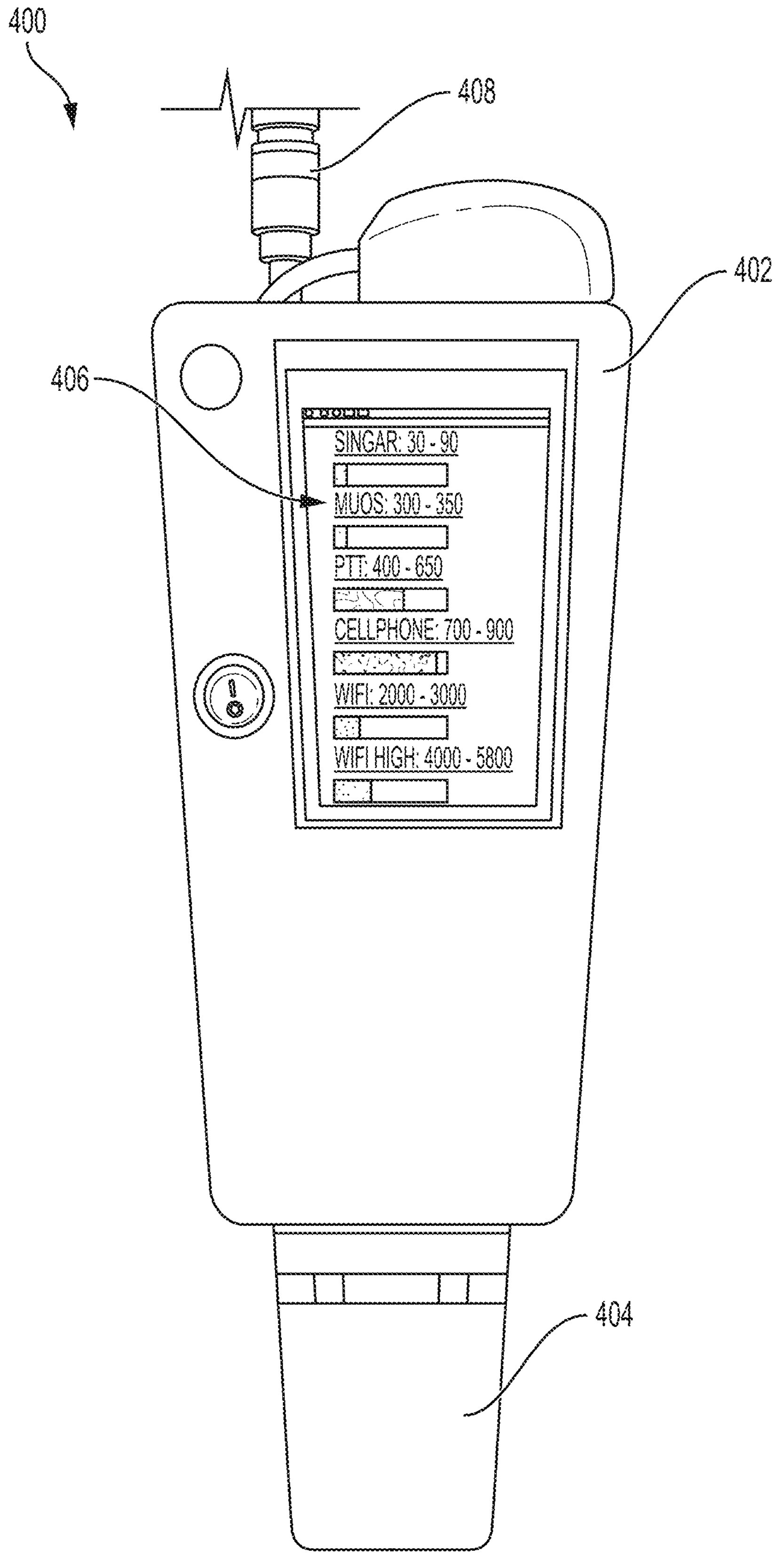
FIG. 4 illustrates an exterior view of another exemplary electromagnetic propagation interference monitoring apparatus with a battery and antenna attached according to some aspects of the present disclosure.

FIG. 4 illustrates an exterior view of another exemplary electromagnetic propagation interference monitoring apparatus 400 with a battery and antenna attached according to some aspects of the present disclosure. In this example, the apparatus 400 includes an enclosure 402, a battery pack 404 attached thereto, and a screen or display 406. Furthermore, this diagram illustrates a selectively attachable RF antenna 408 coupled to the enclosure 402, as well as a GPS antenna 410 coupled to the enclosure 402. As described before, the battery pack 404 may be a standard or commonly used battery pack, which allows the apparatus 400 to be powered with commonly available battery packs rather than a specialized or custom battery pack and, thus, reducing the likelihood of not having electrical energy power sources available to the user.

Figure 5:
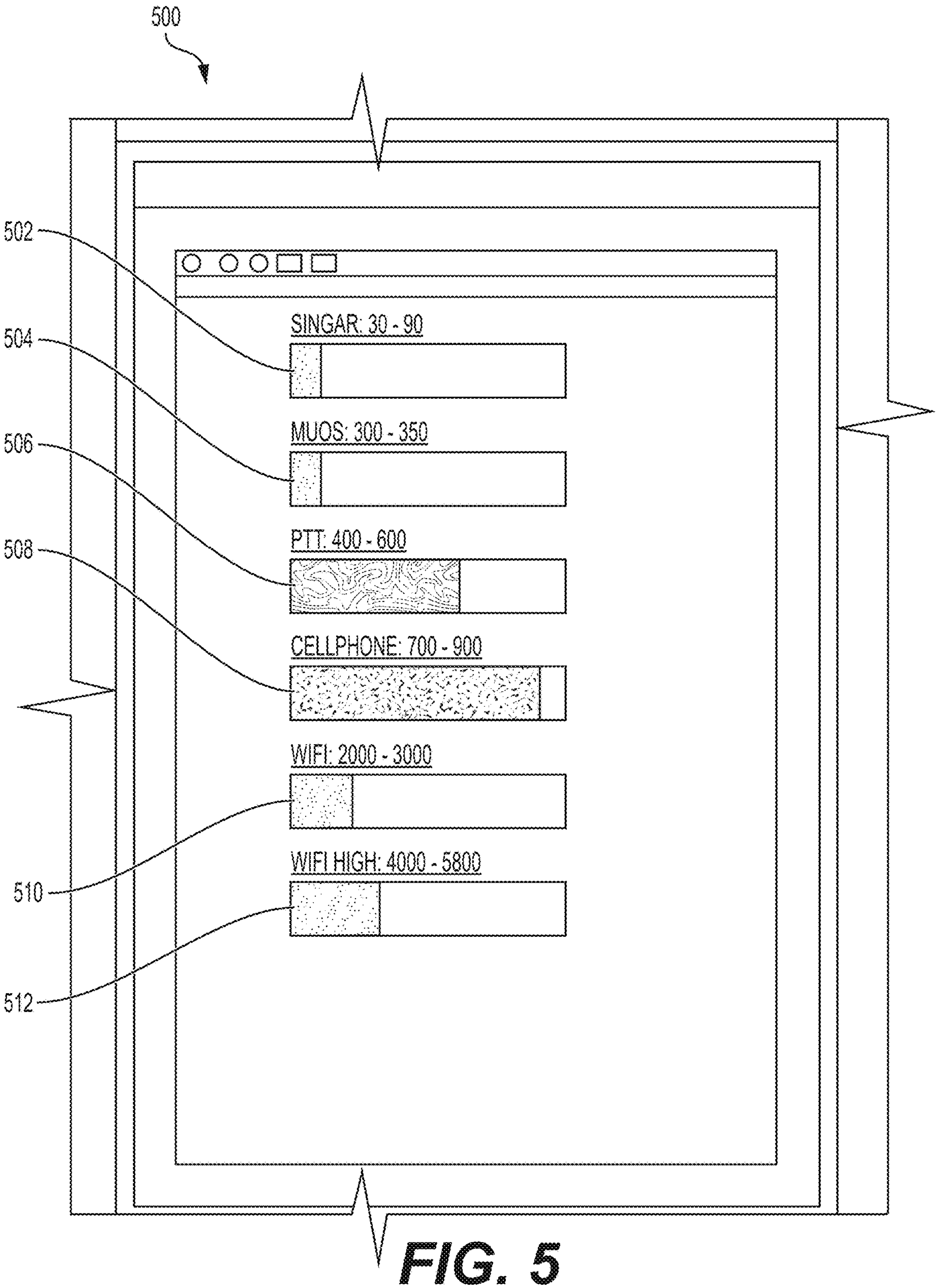
FIG. 5 illustrates an example of a screen display of an exemplary electromagnetic propagation interference monitoring apparatus according to some aspects of the present disclosure.

FIG. 5 illustrates an example of a screen display 500 of an exemplary electromagnetic propagation interference monitoring apparatus (e.g., 100, 200, or 400) according to some aspects of the present disclosure. In certain aspects, at least one progress bar and a plurality of colors within each progress bar are displayed to be able visually indicate the presence of and level of respective EM spectra present in the environment. In this particular example, various frequency spectra are displayed using a progress bar as well a color "temperature" or coding showing large or greater amounts of RF signals with red (as merely one example of a color), medium or mid-level amounts of RF signals with yellow (as merely one example of a color), and small or lessor amounts of RF signals with green (as merely one example of a color) to easily enable a user to see which RF spectra are present and to what degree. In this example shown in FIG. 5, Single Channel Ground and Airborne Radio Systems (SINCGARS) 30-90 MHZ, Mobile User Objective System (MUOS) 300-350 MHz, Push to Talk (PTT) 400-600 MHz, cellular/cell phone 700-900 MHZ, WiFi 2.4 GHz or low, and WiFi 5 GHz or high are illustrated as shown at 502, 504, 506, 508, 510, and 512, respectively. Those skilled in the art will appreciate that these are just exemplary and other SDRs/spectra may be analyzed and displayed such as greater than 6 GHz 5G and beyond communications including millimeter wave (mmWave). Furthermore, those skilled in the art will appreciate that other color schemes may be utilized, and further that the horizontal orientation of the progress bars is merely exemplary and could be arranged vertically as one example of another embodiment.

Figure 6:
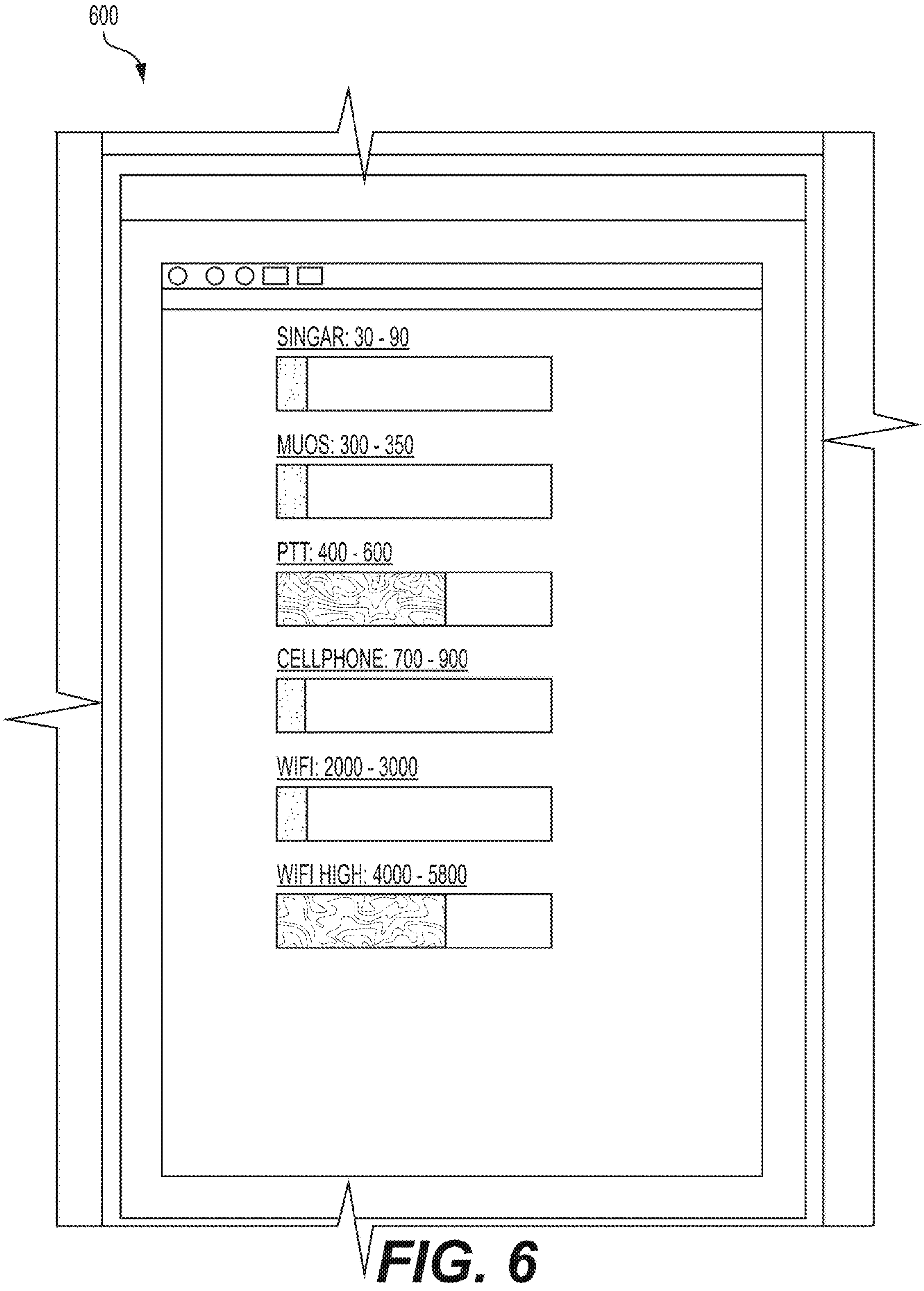
FIG. 6 illustrates another example of a screen display of an exemplary electromagnetic propagation interference monitoring apparatus according to some aspects of the present disclosure.

FIG. 6 illustrates another example of a screen display 600 of an exemplary electromagnetic propagation interference monitoring apparatus according to some further aspects of the present disclosure. This example includes the same spectra as FIG. 5, but with different degrees/levels/intensities in the particular displayed spectra.

According to further aspects, the present system is unique in that the apparatus (e.g., 100, 200, or 400) may be constructed with commercial off the shelf (COTS) parts in conjunction with presently developed software for analyzing and displaying EM information. The system also provides an added capability of recording location data coupled with RF environmental data to allow for a larger picture capture of information, which is a capability that is not afforded by typical known handheld spectrum analyzers.

In yet further aspects, at least part of this system could be used on an unmanned aerial vehicle (UAV), although it is noted that this would involve introducing more EM due to higher power transmissions necessary to communicate from UAV to a user devices. Additionally, the apparatus could be integrated into a heads-up display, augmented reality (AR) goggles, etc., or interface via near field communication (NFC) or Bluetooth for communicative connection with other display capable devices (e.g., mobile phone).

Figure 7:
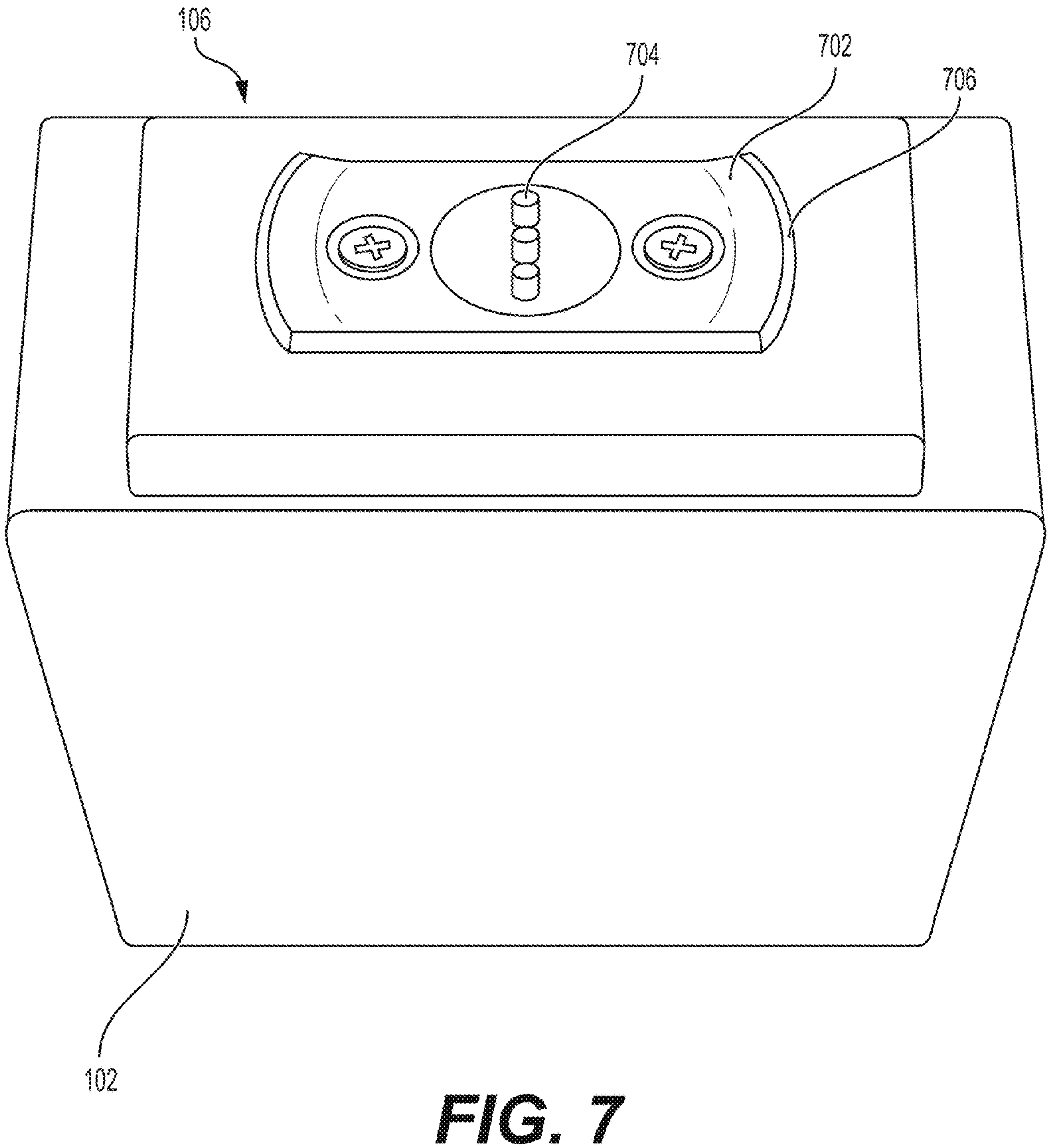
FIG. 7 illustrates an exemplary bottom perspective view 700 of the apparatus 100 illustrated in FIG. 1 according to some aspects of the present disclosure.

FIG. 7 illustrates an exemplary bottom perspective view 700 of the apparatus 100 illustrated in FIG. 1. As illustrated in view 700, the enclosure 102 includes the battery adapter and connector 106 disposed in or on a portion (e.g., end portion) of the enclosure 102. The battery adapter and connector 106 may include an interface plate 702 that is configured to fasten and retain a complementary interface on a battery, such as commonly used radio batteries or batteries for other devices. It is noted that the interface plate 702 may be interchangeable and accommodate any of a plurality of retaining plates for coupling various types of batteries to the device (e.g., 100, 200, or 400). Further, the terminal adapter piece 702 may be configured with an opening or aperture to accommodate a battery connection interface 704 including one or more electrical terminals or connectors for positive, negative and/or neutral battery connections. In the particular example illustrated in FIG. 7, by way of example and not limitation, the interface plate 702 includes tapered or sloped portions 706 that allow for a reciprocal plate on a battery pack (not shown) to be affixed by turning the battery pack (not shown) and locking it into place such that electrical contact is made via the interface 704 and the battery pack is secure by tension.

Although the invention has been described in detail with reference to certain preferred embodiments, variations and modifications exist within the spirit and scope of the invention as described and defined in the following claims.

What is claimed is:

1. A spectrum analysis apparatus comprising:
a handheld enclosure including:
- a processor;
- a spectrum analyzer module communicatively coupled to the processor and configured to provide one or more radio frequency (RF) spectra data to the processor;
- a selectively attachable radio frequency (RF) antenna coupled to spectrum analyzer and configured to be selectively attached to the handheld enclosure;
- a display device configured to display electromagnetic spectrum information derived from the spectrum analyzer module;

a power converter and distributor operable to provide one or more selected voltages to the processor and spectrum analyzer module; and a battery adapter apparatus coupled to the enclosure and communicatively coupled to the power conversion and distribution module and configured to communicatively couple with any of a plurality of standard batteries;

wherein the processor is configured to process the one or more radio frequency (RF) spectra data and display the spectra data in a mode using at least one progress bar and a plurality of colors within the at least one progress bar to visually indicate a level of RF spectra transmissions for each of the one or more radio frequency (RF) spectra.

2. The spectrum analysis apparatus of claim 1, further comprising:

a GPS receiver/antenna configured to provide geographic data to the processor.

3. The spectrum analysis apparatus of claim 1, wherein the spectrum analyzer module comprises a software defined radio (SDR).

4. The spectrum analysis apparatus of claim 2, further comprising:

the processor coupled with a memory device that is configured to store at least one or the one or more radio frequency (RF) spectra data and the geographic data.

5. The spectrum analysis apparatus of claim 2, further comprising:

an input/output port configured to couple to a data or communications network and download the stored at least one or the one or more radio frequency (RF) spectra data and the geographic data.

6. A portable spectrum analysis device comprising:

a processor;

a selectively attachable radio frequency (RF) antenna and configured to selectively attach to a handheld enclosure;

a spectrum analyzer communicatively coupled to the selectively attachable RF antenna and the processor, the spectrum analyzer configured to determine one or more radio frequency (RF) spectra data based on RF signals received with the selectively attachable radio RF antenna and provide the one or more RF spectra data to the processor for processing into electromagnetic spectrum information; and a display disposed in an outer surface of the handheld enclosure for displaying the electromagnetic spectrum information to a user of the device;

wherein the processor configured to process the one or more radio frequency (RF) spectra data and display the spectra data in a mode using a progress bar and a plurality of colors to indicate a respective level of RF spectra transmissions for each of the one or more radio frequency (RF) spectra.

7. The portable spectrum analysis device of claim 6 further comprising:

a power converter and module distributor operable to provide one or more selected voltages to the processor and spectrum analyzer module; and a battery adapter apparatus disposed on the handheld enclosure and communicatively coupled to the power conversion and distribution module for coupling the device with any one of a plurality of battery device types.

8. The portable spectrum analysis device of claim 6, further comprising:

a GPS receiver/antenna configured to provide geographic data to the processor.

9. The portable spectrum analysis device of claim 6, wherein the spectrum analyzer comprises a software defined radio (SDR).

10. The portable spectrum analysis device of claim 8, further comprising:

a memory device communicatively coupled with the processor for storing at least one or the one or more radio frequency (RF) spectra data and the geographic data.

11. The portable spectrum analysis device of claim 8, further comprising:

an input/output port configured to couple to a data or communications network and download the stored at least one or the one or more radio frequency (RF) spectra data and the geographic data.

* * * * *